United States Patent
Seo

(10) Patent No.: US 6,342,409 B1
(45) Date of Patent: Jan. 29, 2002

(54) POLYSILICON THIN FILM TRANSISTOR AND METHOD OF MANUFACTURING THE SAME

(75) Inventor: Seong Moh Seo, Inchon (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/576,431

(22) Filed: May 22, 2000

(30) Foreign Application Priority Data

May 21, 1999 (KR) .................................. 1999-0018387

(51) Int. Cl.[7] .............................................. H01L 21/84
(52) U.S. Cl. ...................................... 438/161; 438/166
(58) Field of Search .............................. 438/161, 166, 438/486

(56) References Cited

U.S. PATENT DOCUMENTS

| | | | |
|---|---|---|---|
| 4,309,225 A | 1/1982 | Fan et al. ...................... 438/72 |
| 4,626,448 A | 12/1986 | Hays ........................... 427/576 |
| 5,147,826 A | 9/1992 | Liu et al. ..................... 438/436 |
| 5,275,851 A | 1/1994 | Fonash et al. ............... 438/479 |
| 5,364,664 A | 11/1994 | Tsubouchi et al. .......... 427/535 |
| 5,403,763 A | 4/1995 | Yamazaki ................... 438/268 |
| 5,403,772 A | 4/1995 | Zhang et al. ................ 438/166 |
| 5,426,064 A | 6/1995 | Zhang et al. ................ 438/166 |
| 5,481,121 A | 1/1996 | Zhang et al. ................ 257/64 |
| 5,488,000 A | 1/1996 | Zhang et al. ................ 438/166 |
| 5,492,843 A | 2/1996 | Adachi et al. ............... 438/479 |
| 5,501,989 A | 3/1996 | Takayama et al. .......... 438/155 |
| 5,508,533 A | 4/1996 | Takemura .................... 257/72 |
| 5,529,937 A | 6/1996 | Zhang et al. ................ 438/486 |
| 5,534,716 A | 7/1996 | Takemura .................... 257/72 |
| 5,543,352 A | 8/1996 | Ohtani et al. ................ 438/487 |
| 5,550,070 A | 8/1996 | Funai et al. ................. 438/486 |
| 5,569,610 A | 10/1996 | Zhang et al. ................ 438/166 |
| 5,576,222 A | 11/1996 | Arai et al. ................... 438/59 |
| 5,619,044 A | 4/1997 | Makita et al. ............... 257/64 |
| 5,639,698 A | 6/1997 | Yamazaki et al. ........... 438/486 |
| 5,663,077 A | 9/1997 | Adachi et al. ............... 438/151 |
| 5,677,240 A | 10/1997 | Murikami et al. ........... 438/609 |
| 5,923,962 A * | 7/1999 | Ohtani ......................... 438/150 |
| 5,985,741 A | 11/1999 | Yamazaki et al. ........... 438/486 |
| 6,066,547 A | 5/2000 | Maekawa .................... 438/486 |
| 6,162,667 A * | 12/2000 | Funai ........................... 438/166 |

FOREIGN PATENT DOCUMENTS

| | | |
|---|---|---|
| JP | 21-40915 | 5/1990 |
| JP | 80-06053 | 1/1996 |

OTHER PUBLICATIONS

K.S. Song, S.H. Park, S.I. Jun and D.K. Choi, "A Crystallization of the Amorphous Silicon Using Field Aided Lateral Crystallization" Department of Inorganic Materials Engg., Hanyang University, 1997, pp. 144–150.

(List continued on next page.)

Primary Examiner—John F. Niebling
Assistant Examiner—Stacy A Whitmore
(74) Attorney, Agent, or Firm—Long Aldridge & Norman, LLP

(57) ABSTRACT

The present invention discloses a method of manufacturing a polycrystalline silicon thin film transistor including forming a buffer layer on a substrate; depositing an impurity-doped amorphous silicon layer on the buffer layer and patterning the impurity-doped amorphous silicon layer into source and drain regions, where the source and drain regions are spaced apart from each other; forming a metal layer over the entire substrate while covering the source and drain regions; depositing an intrinsic amorphous silicon layer on the metal layer; applying a voltage to the intrinsic amorphous silicon layer to simultaneously crystallize the intrinsic amorphous silicon layer and the source and drain regions so that the intrinsic amorphous silicon layer is converted into a polycrystalline silicon layer; and patterning the polycrystalline silicon layer to form an active layer so that part of the polycrystalline silicon layer overlaps the source and drain regions.

22 Claims, 5 Drawing Sheets

OTHER PUBLICATIONS

Materials Research Society, Abstracts, Apr. 13–17, 1998, p. 55.

Kyung–Sub Song & Duck–Kyun Choi, "Electric Field Effect on Metal Induced Crystallization of Amorphous Silicon", Proceedings of the Eighth International Symposium on Silicon—on Insulator Technology and Devices, vol. 97–23, pp. 75–80.

Kyung–Sub Song, Seung–Ik Jun, Sang–Hyun Park & Duck–Kyun Choi, "I–V Characteristics of Poly–Silicon Thin Film Transistors by Field Aided Lateral Crystallization (FALC)," $5^{th}$ International Conference on VLSI and CAD, Oct. 13–15, 1997, pp. 187–189.

Seung–Ik Jun et al., "Fabrication of Low Temperature Poly–Silicon Thin Film Transistor Using Field Aided Lateral Crystallization (FALC)," The First Asian–European International Conference on Plasma Surface Engineering, Oct. 5–9, 1997.

Kyung–Sub Song et al., "Enhanced Crystallization of Amorphous Silicon Using Electric Field," Proc. The $12^{th}$ KACG Tech. Meeting and the $4^{th}$ Korea–Japan EMGS.

Y. Masaki, P.G. LeComber, A.G. Fitzgerald, "Solid Phase Crystallization of Thin Films of Si Prepared by Plasma–Enhanced Chemical Vapor Disposition," J. Appl. Phys. 74 (1), Jul. 1, 1993, pp. 129–134.

Dong Hyun Sohn et al., "Low Temperature Crystallization of Amorphous Si Films By Metal Adsorption and Diffusion", Jpn. J. Appl. Phys., vol. 35 (1996) Pt. 1, No. 2B, pp. 1005–1009.

Jai II Ryu et al., "A Novel Self–Aligned Polycrystalline Silicon Thin–Film Transistor Using Silicide Layers", IEEE Electron Device Letters, vol. 11, No. 6, Jun. 1997, pp. 123–125.

Y. Kawazu, et al., "Low–Temperature Crystallization of Hydrogenated Amorphous Silicon Induced by Nickel Silicide Formation", Japanese Journal of Applied Phys., vol. 29, No. 12, Dec. 1990, pp. 2698–2704.

U.S. application No. 09/115,498, filed Apr. 14, 1998, Jang et al., 8733.6584.

U.S. application No. 09/299,571, filed Apr. 27, 1999, Jang et al., 8733.8205.

U.S. application No. 09/350,816, filed Apr. 9, 1999, Jang et al., 8733.20020.

U.S. application No. 09/170,625, filed Oct. 13, 1998, Choi, 8733.6836.

* cited by examiner

POLYSILICON THIN FILM TRANSISTOR AND METHOD OF MANUFACTURING THE SAME

CROSS REFERENCE

This application claims the benefit of Korean Patent Application No. 1999-18387, filed on May 20, 1999, under 35 U.S.C. § 119, the entirety of which is hereby incorporated by reference.

BACKGROUND OF THE INVENTION

1. Field of the Invention

The present invention relates to a thin film transistor (TFT), and more particularly, to a stagger type polycrystalline silicon thin film transistor (Poly-Si TFT) and a method of manufacturing the same.

2. Description of Related Art

In order to form a polycrystalline silicon layer as an active layer of a TFT, an intrinsic amorphous silicon layer is first deposited on a substrate using a plasma chemical vapor deposition (PCVD) technique or a low pressure chemical vapor deposition (LPCVD) technique so that an amorphous silicon layer is formed. Second, the amorphous silicon layer is crystallized through one of several processes that may include a laser annealing technique, a solid phase crystallization (SPC) technique, and a metal induced crystallization (MIC) technique.

FIGS. 1A to 1D are cross-sectional views illustrating a known process of manufacturing a stagger type Poly-Si TFT. As shown in FIG. 1A, source and drain electrodes 2 and 4 are formed on a substrate 1, and source and drain regions 6 and 8, which are ohmic contact layers with an n-type or p-type impurity, are formed on the source and drain electrodes 2 and 4, respectively. As shown in FIG. 1B, an amorphous silicon layer 10 is deposited on the source and drain regions 6 and 8 while covering the exposed portions of the substrate 1. Then, the amorphous silicon layer 10 undergoes the crystallization process using the laser annealing technique together to form a polycrystalline silicon layer together with the source and drain regions 6 and 8. Before the crystallization process, dehydrogenation is typically performed to prevent a surface of the polycrystalline layer from being damaged due to hydrogen.

At this point in the described Poly-Si TFT fabrication process, the layers to be crystallized differ in thickness at certain locations of the amorphous silicon layer 10. Specifically, the portion of the amorphous silicon layer 10 where the polycrystalline silicon layer is to be formed is only one layer thick, while the portion of the amorphous silicon layer 10 that overlaps the source and drain regions 6 and 8 is two layers thick. As described above, the amorphous silicon layer 10 will be crystallized simultaneously with the source and drain regions 6 and 8. Therefore, an energy density capable of crystallizing the single layer-thick amorphous silicon layer 10 and the two layer-thick source and drain regions 6 and 8 at the same time is required. However, there is a problem in that the required energy density causes grains of the polycrystalline silicon layer 10 to be very small.

Subsequently, an activation process using a laser beam or a high-temperature, long-duration heat-treatment process is performed to activate the source and drain regions 6 and 8. In the embodiment shown in FIGS. 1B and 1C, the source and drain regions 6 and 8 and the amorphous silicon layer 10 are formed from the same material. Through the crystallization process, the two separate layers depicted in FIG. 1B will be reduced to a single polycrystalline silicon layer 10. Then, as shown in FIG. 1C, the polycrystalline silicon layer 10 is patterned into an active layer 10'. A gate insulating layer 12 of $SiO_2$ or $SiN_X$ is formed on the active layer 10'. As shown in FIG. 1D, a gate electrode 14 is formed on the gate insulating layer 12, and the gate electrode 14 is narrower in width than the gate insulating layer 12.

In the process of manufacturing the stagger type Poly-Si TFT described above, the active layer 10' may be disadvantageously severed at the step-shaped portions of the source and drain electrodes 2 and 4. This effect occurs because the source and drain electrodes 2 and 4 expand or contract due to thermal expansion stresses caused by the laser beam or high temperature during the crystallization process. However, this effect can be avoided by using the same material for the source and drain electrodes 2 and 4 as for the polycrystalline silicon layer 10. Specifically, in such a case the source and drain electrodes 2 and 4 have the same thermal expansion coefficient as that of the polycrystalline silicon layer and therefore the severing of the polycrystalline silicon layer at the step-shaped portions of the source and drain regions can be inhibited.

However, as described above, grains of the polycrystalline silicon layer are disadvantageously small in size.

Further, in the case of using the MIC technique for crystallization, there is a disadvantage in that the processing time is lengthy.

SUMMARY OF THE INVENTION

It is an object of the present invention to provide a stagger type Poly-Si TFT having a good electric characteristics and a method of manufacturing the same with a short processing time.

In order to achieve the above object, the present invention provides a method of manufacturing a polycrystalline silicon thin film transistor, comprising; forming a buffer layer on a substrate; depositing an amorphous silicon layer with an impurity on the buffer layer and patterning the amorphous silicon layer with the impurity into source and drain regions, the source and drain regions being spaced apart from each other; forming a metal layer over the entire substrate while covering the source and drain regions; depositing an intrinsic amorphous silicon layer on the metal layer; applying a voltage to the intrinsic amorphous silicon layer to simultaneously crystallize the intrinsic amorphous silicon layer and the source and drain regions so that the intrinsic amorphous silicon layer is converted into a polycrystalline silicon layer; and patterning the polycrystalline silicon layer to form an active layer so that part of the polycrystalline silicon layer overlaps the source and drain regions.

The present invention further comprises forming a gate insulating layer and a gate electrode on the active layer; forming a passivation film over the entire substrate while covering the gate electrode; forming contact holes; and forming source and drain electrodes, contacting with the source and drain regions respectively through the contact holes.

The present invention further comprises the step of ion-doping the polycrystalline silicon layer using the gate electrode as a mask after formation of the gate electrode to form a Lightly-Doped-Drain (LDD) structure.

The gate insulating layer and the gate electrode are spaced apart from the source and drain regions, and the buffer layer, the passivation film, and the gate insulating layer are all made of a material selected from a group consisting SiNx, SiO$_2$, and tetra ethoxy silane (TEOS). The amorphous silicon layer with the impurity is an n-type semiconductor containing PH$_3$ gas or a p-type semiconductor containing B$_2$H$_6$ gas. The metal layer is made of a material selected from a group consisting of Ni, Pb, and Co. The metal layer can be located on the intrinsic amorphous silicon layer.

BRIEF DESCRIPTION OF THE DRAWINGS

For a more complete understanding of the present invention and the advantages thereof, reference is now made to the following descriptions taken in conjunction with the accompanying drawings, and in which.

DETAILED DESCRIPTION OF PREFFERED EMBODIMENTS

Reference will now be made in detail to the preferred embodiments of the present invention, example of which is illustrated in the accompanying drawings.

Figure 1A:
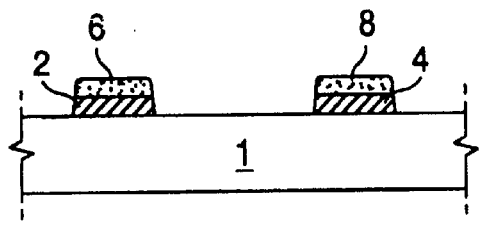
FIGS. 1A to 1D are cross-sectional views illustrating a process of manufacturing a stagger type Poly-Si TFT according to the conventional art.
Figure 1B:
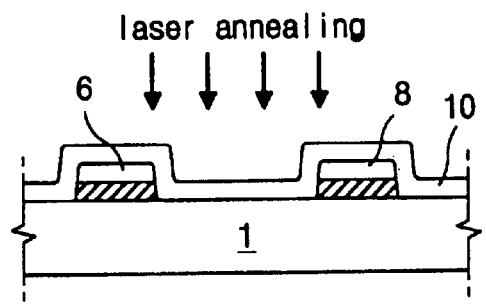
Figure 1C:
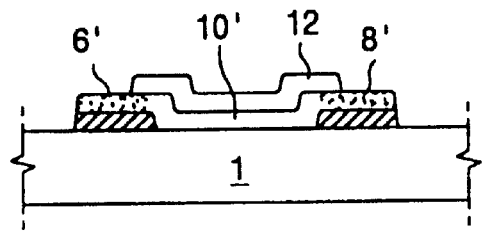
Figure 1D:
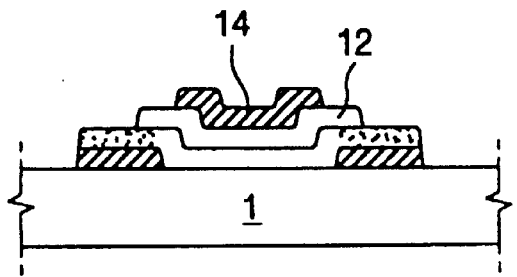
Figure 2A:
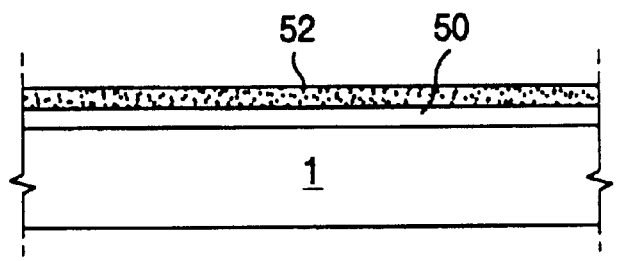
FIGS. 2A to 2F are cross-sectional views illustrating a process of manufacturing a stagger type Poly-Si TFT according to a first embodiment of the present invention.
Figure 2B:
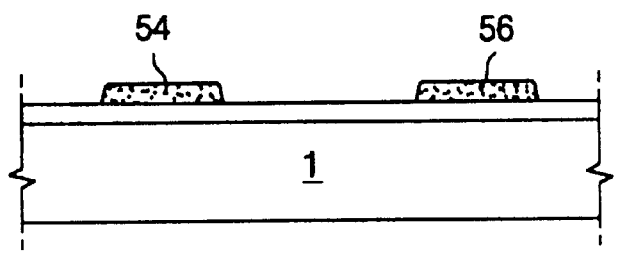
Figure 2C:
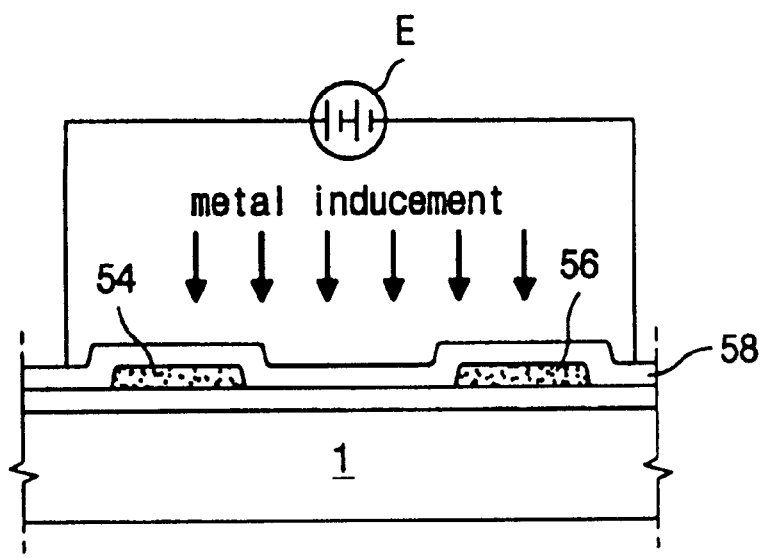

FIGS. 2A to 2F are cross-sectional views illustrating a process of manufacturing a stagger type Poly-Si TFT according to a first embodiment of the present invention. As shown in FIG. 2A, a buffer layer 50 is formed on a substrate 1 to prevent extraction of alkali material contained in the substrate 1. Doped amorphous silicon layer 52 with a p-type impurity such as PH$_3$ or an n-type impurity such as B$_2$H$_6$ is then deposited on the buffer layer 50 and patterned into source and drain regions 54 and 56 (see FIG. 2B). Sequentially, as shown in FIG. 2C, an intrinsic amorphous silicon layer 58 is deposited on the source and drain regions 54 and 56 while covering the entire substrate 1. Then, a metal layer (not shown) is formed on the intrinsic amorphous silicon layer 58 using a sputter technique, a vacuum evaporator technique, or by spin coating technique. The metal layer is made of a material selected from a group consisting of Ni, Pb, and Co.

Alternatively, the metal layer (not shown) may be deposited before the intrinsic amorphous silicon layer 58 is deposited covering the source and drain regions 54 and 56 and the entire substrate 1. However, it is preferred that the metal layer is formed after the amorphous silicon layer 58 is deposited.

Subsequently, a direct current (DC) voltage is applied to the amorphous silicon layer 58 for crystallization. Preferably, a conventional heat treatment technique is applied simultaneously with the voltage. The inventive crystallization technique is more advanced than the conventional MIC technique and is referred to as a field enhanced metal induced crystallization (FE-MIC). In the FE-MIC technique, a DC voltage is applied to a thin film to be crystallized to decrease both the crystallization time and the crystallization temperature. The intrinsic amorphous silicon layer 58 and the source and drain regions 54 and 56 are simultaneously crystallized using the FE-MIC technique.

Figure 2D:
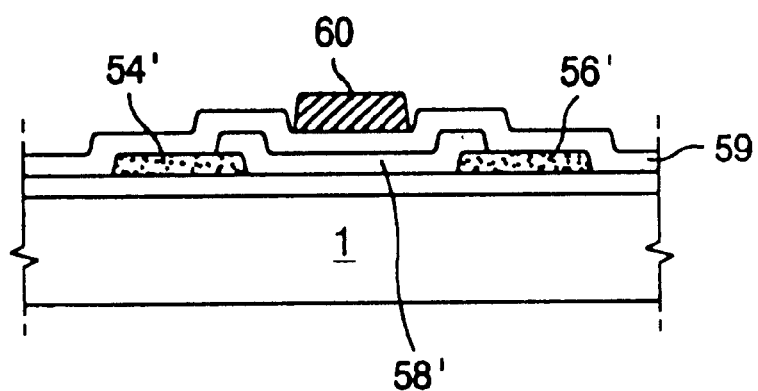
Figure 2E:
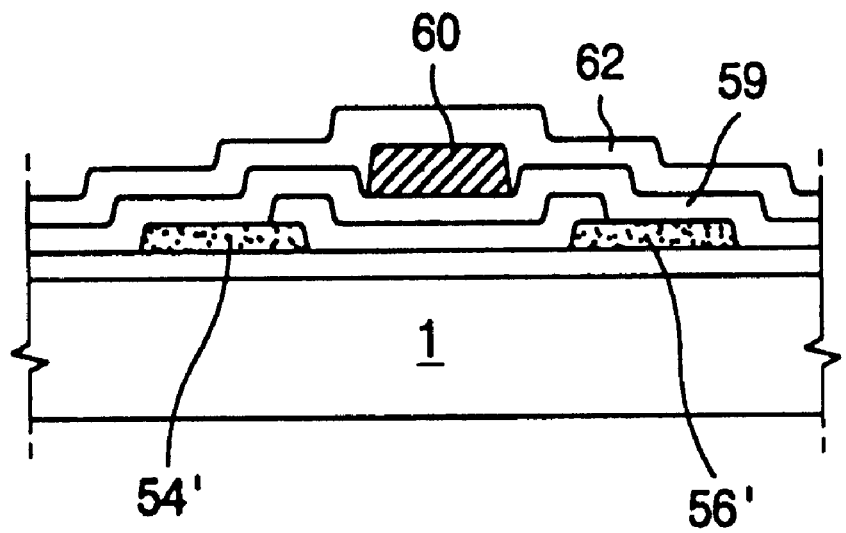
Figure 2F:
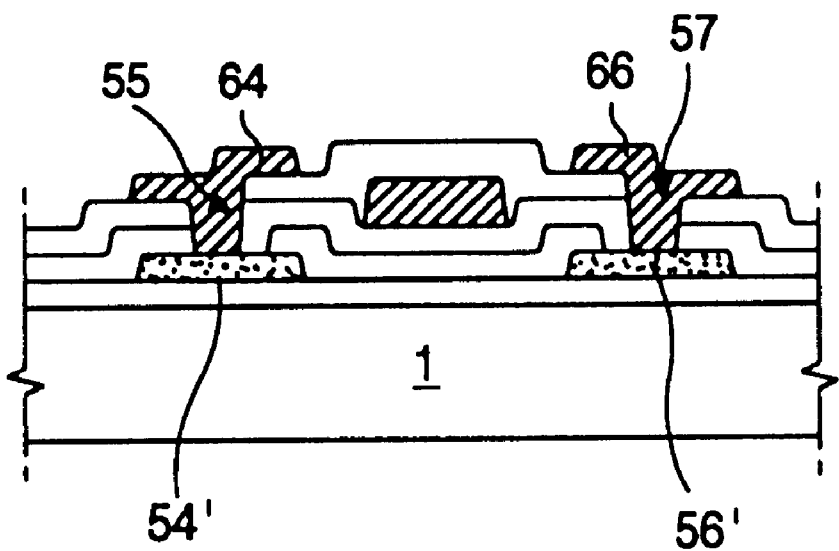

Then, as shown in FIG. 2D, the polycrystalline silicon layer 58 is patterned into an active layer 58' in the form of an island overlying a part of each of the source and drain regions 54 and 56, and the area of the substrate 1 between the source and drain regions 54 and 56. A gate insulating layer 59 is formed over the entire substrate 1, and then a gate electrode 60 is formed over the active layer 58'. Sequentially, as shown in FIGS. 2E and 2F, a passivation film 62 is deposited over the entire substrate 1 while covering the gate electrode 60, and then contact holes 55 and 57 are formed, exposing respectively the source and drain regions 54' and 56'. Source and drain electrodes 64 and 66 are formed to respectively contact the source and drain regions 54' and 56' through the respective contact holes 55 and 57, whereupon the stagger type Poly-Si TFT according to the first embodiment of the present invention is completed.

As described above, using the FE-MIC technique according to the first embodiment of the present invention, fabrication processing time is reduced since the activation process and ion doping process of the conventional art are omitted. Further, the inventive FE-MIC technique provides a faster crystallization rate and superior electric characteristics to the conventional MIC technique.

Poly-Si TFT fabrication using the FE-MIC technique generally poses a problem, called a short channel effect. The effect arises due to the fact that since the source and drain electrodes 64 and 66 are close to each other, the depletion region of the source and drain electrodes 64 and 66 extend into the channel region, thus causing threshold voltage variation or lowering of channel conductance. One method of avoiding the problem of short channel effect is shown in the preferred embodiment depicted in FIGS. 2D, 2E, and 2F. As can be seen, there is an offset between the gate electrode 60 and the source and drain regions 54' and 56'. This offset region, which is defined as the space between the edges of gate electrode 60 and the edges of source and drain regions 54' and 56', prevents the threshold voltage variation or lowering of channel conductance that causes the short channel effect.

A second embodiment of the present invention is also intended to prevent short channel effect and, to achieve this, a Lightly-Doped-Drain (LDD) structure or an offset structure is proposed. The short channel effect is also referred to as a hot carrier effect.

Figure 3A:
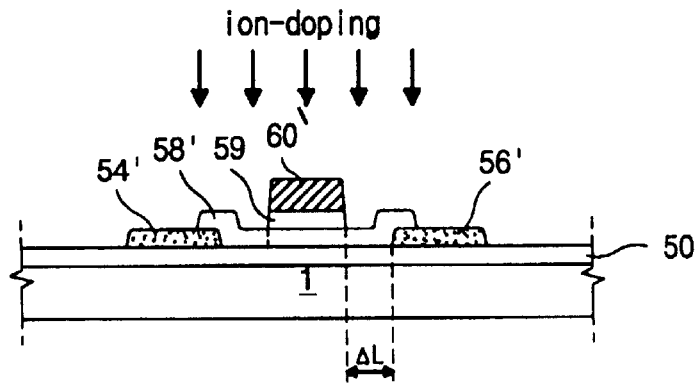
FIGS. 3A and 3C are cross-sectional views illustrating a process of manufacturing a stagger type Poly-Si TFT according to a second embodiment of the present invention.
Figure 3B:
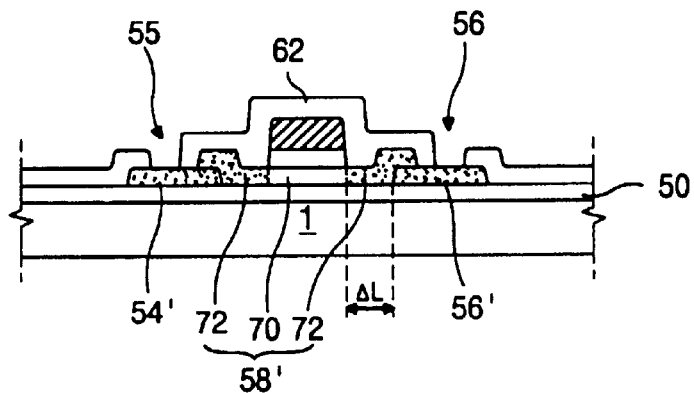
Figure 3C:
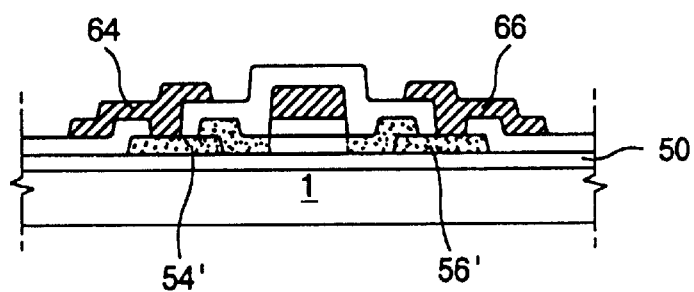

FIGS. 3A to 3C are cross-sectional views illustrating process steps to be conducted subsequent to the process shown in FIG. 2C. As shown in FIG. 3A, the polycrystalline silicon layer 58 is patterned to form the active layer 58' such that both its end portions overlap the source and drain regions 54' and 56', respectively. Then, a gate insulating layer 59 and a gate electrode 60 are formed on the active layer 58', spaced a distance of ΔL from the source and drain regions 54' and 56'.

In alternative embodiments, an ion-doping process may be performed to form the LDD structure, or the ion-doping process may be omitted to form the offset structure.

For the LDD structure, ion doping using a gas including one of a boron group such as B$_2$H$_6$ or one of a phosphorous group such as PH$_3$ is performed using the gate electrode 60 as a mask so that the portion of active layer 58' that is not masked by gate electrode 60 is ion-doped. At this point, as shown in FIG. 3B, the active layer 58' is divided into a first active layer 70 that is not ion-doped and a second active layer 72 that is ion-doped. The second active layer 72 is lower in density of impurities than the source and drain regions 54' and 56', thereby forming the LDD structure. In other words, when the second active layer 72 is ion-doped, the second active layer 72 and the source and drain regions 54' and 56' each differ in ion densities, thus suppressing the hot carrier effect.

Alternatively, when the ion-doping process is not carried out, an offset of ΔL formed between the gate electrode 60 and the source and drain regions 54' and 56' reduces current leakage that deteriorates the switching operation of the TFT, thereby suppressing the hot carrier effect.

Sequentially, as shown in FIG. 3B, a passivation film 62 is deposited over the entire substrate 1 while covering the gate electrode 60. Passivation film 62 is then patterned to expose portions of the source and drain regions 54' and 56' other than the portions of the source and drain regions 54' and 56' overlapped by the active layer 58'. The portion of passivation film 62 thus patterned to expose portions of source and drain regions 54' and 56' form contact holes 55 and 56. Finally, source and drain electrodes 64 and 66 are formed to contact the source and drain regions 54' and 56' respectively.

In various embodiments, the buffer layer, the passivation film, and the gate insulating layer are all made of a material selected from a group comprising SiNx, SiO$_2$, and tetra ethoxy silane (TEOS).

As described herein, using the FE-MIC technique according to the preferred embodiments of the present invention, a stagger type Poly-Si TFT fabricated with short processing time and improved electric characteristics is obtained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing a polycrystalline silicon thin film transistor, comprising;

forming a buffer layer on a substrate;

depositing on the buffer layer an impurity-doped amorphous silicon layer and patterning the impurity-doped amorphous silicon layer into source and drain regions, the source and drain regions being spaced apart from each other;

forming a metal layer over the entire substrate while covering the source and drain regions;

depositing an intrinsic amorphous silicon layer on the metal layer;

applying a voltage to the intrinsic amorphous silicon layer to simultaneously crystallize the intrinsic amorphous silicon layer and the source and drain regions so that the intrinsic amorphous silicon layer is converted into a polycrystalline silicon layer; and patterning the polycrystalline silicon layer to form an active layer so that part of the polycrystalline silicon layer overlaps at least a portion of the source and drain regions.

2. The method of claim 1, further comprising:

forming a gate insulating layer and a gate electrode on the active layer, forming a passivation film over the entire substrate while covering the gate electrode;

forming contact holes; and forming source and drain electrodes, respectively contacting the source and drain regions through the contact holes.

3. The method of claim 2, further comprising ion-doping the polycrystalline silicon layer using the gate electrode as a mask after formation of the gate electrode.

4. The method of claim 2, wherein the gate insulating layer and the gate electrode are spaced apart from the source and drain regions.

5. The method of claim 2, wherein the buffer layer, the passivation film, and the gate insulating layer are all made of a material selected from a group consisting SiNx, SiO$_2$, and tetra ethoxy silane (TEOS).

6. The method of claim 1, wherein the impurity-doped amorphous silicon layer is an n-type semiconductor containing PH$_3$ gas.

7. The method of claim 1, wherein the impurity-doped amorphous silicon layer is a p-type semiconductor containing B$_2$H$_6$ gas.

8. The method of claim 1, wherein the metal layer is made of a material selected from a group consisting of Ni, Pb, and Co.

9. A method of manufacturing a polycrystalline silicon thin film transistor, comprising;

forming a buffer layer on a substrate;

depositing an impurity-doped amorphous silicon layer on the buffer layer and patterning the impurity-doped amorphous silicon layer into source and drain regions, the source and drain regions being spaced apart from each other;

depositing an intrinsic amorphous silicon layer over the entire substrate while covering the source and drain regions;

forming a metal layer on the intrinsic amorphous silicon layer;

applying a voltage to the intrinsic amorphous silicon layer to simultaneously crystallize the intrinsic amorphous silicon layer and the source and drain regions so that the intrinsic amorphous silicon layer is converted to a polycrystalline silicon layer;

patterning the polycrystalline silicon layer to form an active layer so that part of the polycrystalline silicon overlaps at least a portion of the source and drain regions;

forming a gate insulating layer and a gate electrode on the active layer;

forming a passivation film over the entire substrate while covering the gate electrode;

forming contact holes; and forming source and drain electrodes respectively contacting the source and drain regions through the contact holes.

10. The method of claim 9, further comprising ion-doping the polycrystalline silicon layer using the gate electrode as a mask after formation of the gate electrode.

11. The method of claim 9, wherein the gate insulating layer and the gate electrode are spaced apart from the source and drain regions.

12. The method of claim 9, wherein the buffer layer, the passivation film, and the gate insulating layer are all made of a material selected from a group consisting SiNx, SiO$_2$, and tetra ethoxy silane (TEOS).

13. The method of claim 9, wherein the impurity-doped amorphous silicon layer is an n-type semiconductor containing PH$_3$ gas.

14. The method of claim 9, wherein the impurity-doped amorphous silicon layer is a p-type semiconductor containing B$_2$H$_6$ gas.

15. The method of claim 9, wherein the metal layer is made of a material selected from a group consisting of Ni, Pb, and Co.

16. A method of manufacturing a polycrystalline silicon thin film transistor, comprising;

depositing on a substrate a first impurity-doped amorphous silicon layer and patterning the first amorphous silicon layer into source and drain regions, the source and drain regions being spaced apart from each other;

forming a metal layer over the substrate covering the source and drain regions;

depositing a second amorphous silicon layer on the metal layer;

applying a voltage to the second amorphous silicon layer to simultaneously crystallize the second amorphous silicon layer and the source and drain regions so that the second amorphous silicon layer is converted into a polycrystalline silicon layer; and patterning the polycrystalline silicon layer to form an active layer so that part of the polycrystalline silicon layer overlaps at least a portion of the source and drain regions.

17. The method of claim 16, further comprising forming a buffer layer on the substrate.

18. The method of claim 16, further comprising ion-doping the polycrystalline silicon layer using the gate electrode as a mask after formation of the gate electrode.

19. The method of claim 16, wherein the gate insulating layer and the gate electrode are spaced apart from the source and drain regions.

20. The method of claim 16, wherein the buffer layer, the passivation film, and the gate insulating layer are all made of a material selected from a group consisting SiNx, $SiO_2$, and tetra ethoxy silane (TEOS).

21. The method of claim 16, wherein the amorphous silicon layer with the impurity is one of an n-type semiconductor containing $PH_3$ gas and a p-type semiconductor containing $B_2H_6$ gas.

22. The method of claim 16, wherein the metal layer is made of a material selected from a group consisting of Ni, Pb, and Co.

* * * * *